DIELECTRIC TUNING SYSTEM

Filed June 30, 1948

INVENTOR
ROBERT L. HARVEY
BY Philip J. Cooper
ATTORNEY

Patented Sept. 16, 1952 2,611,088

UNITED STATES PATENT OFFICE 2,611,088

DIELECTRIC TUNING SYSTEM

Robert L. Harvey, Princeton, N. J., assignor to Radio Corporation of America, a corporation of Delaware Application June 30, 1948, Serial No. 36,071

13 Claims. (Cl. 250—36)

This invention relates generally to dielectric tuning systems and particularly to resonant circuits or structures tunable over an ultra high frequency range by a core having a high dielectric constant.

A number of frequencies within the ultra high frequency range from 100 to 1,000 megacycles (mc.) have recently been allocated to various commercial broadcasting services. Thus, frequency modulated carrier waves as well as black and white television may be broadcast within that frequency range; the frequency range from 480 to 920 mc. has been tentatively allocated for experimental work relating to color television. It is therefore extremely important for the reception of modulated carrier waves that resonant circuits or structures as well as oscillation generators be provided which are tunable over a fairly wide ultra high frequency range.

In the past, resonant circuits comprising lumped capacitance and inductance have been tuned in various manners. In the radio broadcast field it is conventional practice to tune a receiver by a tuning condenser. More recently, resonant circuits have also been tuned by moving a ferromagnetic core relatively to the inductance coil of the circuit to vary the inductance of the circuit. However, permeability tuning cannot be used at frequencies of the order of 100 mc. or more in view of the high losses caused by the ferromagnetic core. It is furthermore known that the frequency of a resonant circuit can be adjusted by eddy current tuning, in which case the inductance of the resonant circuit is altered by moving a non-magnetic core of high conductivity with respect to the coil. Eddy current tuning inherently has high losses which become prohibitive at ultra high frequencies. Accordingly, none of these methods are feasible for tuning a resonant circuit within an ultra high frequency range substantially above 100 mc. In accordance with the present invention dielectric tuning is utilized where a core having a high dielectric constant is moved relatively to an inductance element or to a resonant structure having a distributed inductance and capacitance to change the capacitance of the resonant circuit. Dielectric tuning is particularly adapted for the ultra high frequency range.

A resonant structure having distributed inductance and lumped capacitance, represented by spaced plates, can be tuned by changing the capacitance as by moving a dielectric member with respect to the spaced plates. Such a resonant structure, however, has a low Q, where Q is the energy stored by the circuit divided by the energy lost per cycle of the resonant frequency of the circuit. Furthermore, the tuning range of the circuit is limited because the resonant structure has an appreciable fixed minimum capacitance, and only the additional capacitance provided by the movable dielectric member can be altered.

An oscillation generator developing a wave of a frequency which is adjustable over an appreciable ultra high frequency range preferably should not have any sliding contacts since such contacts are a source of erratic operation in ultra high frequency circuits. Furthermore, it is desirable that the frequency of the wave developed by the oscillation generator can be changed by a single control.

It is the principal object of the present invention, therefore, to provide novel dielectric tuning systems suitable for use within an ultra high frequency range.

A further object of the invention is to provide an inductance element, or a resonant structure having distributed inductance and capacitance, which may be tuned over an appreciable ultra high frequency range by sliding within the inductance element or resonant structure a core having a high dielectric constant.

Another object of the invention is to provide an ultra high frequency oscillation generator tunable within a considerable frequency range by a single control without utilizing sliding contacts.

In accordance with the present invention a dielectric tuning system for ultra high frequencies comprises an inductance element such as a coil, particularly a strap wound coil, and a dielectric core. The core has a high dielectric constant which is preferably in excess of 1,000 and is movable relatively to the coil to vary the resonant frequency of the coil. Movement of the core will alter or vary the distributed capacitance between the individual windings of the coil and the dielectric core.

An ultra high frequency oscillatory circuit embodying the present invention may also comprise a resonant structure having distributed inductance and capacitance and a substantially uniform voltage distribution across its outer surface. Such a structure preferably consists of a cylinder of conducting material slotted along its length. A dielectric core is movable with respect to the cylinder and preferably slides axially within the cylinder. Such an oscillatory circuit has a comparatively high Q and may be used with advantage in an ultra high frequency oscillation generator.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
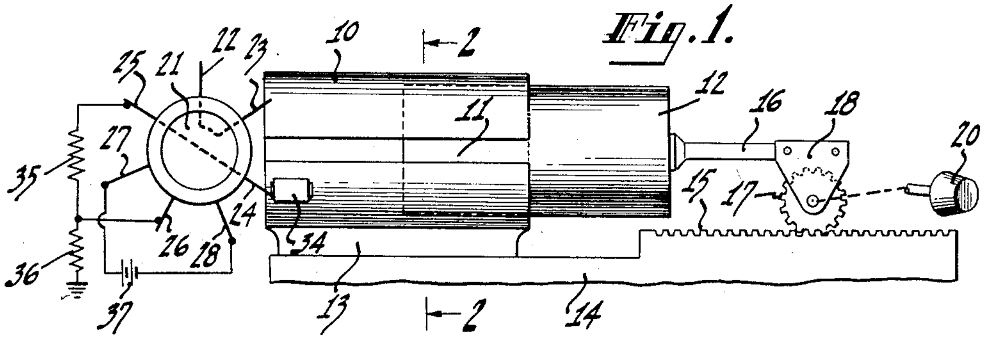
Fig. 1 is an elevational view of an ultra high frequency oscillation generator including a tunable resonant structure in accordance with the present invention.
Figure 2:
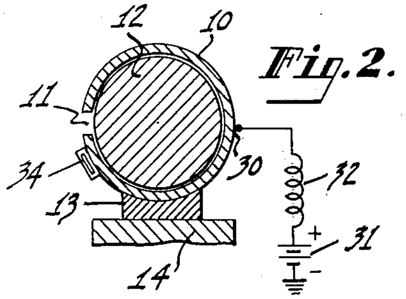
Fig. 2 is a cross sectional view taken along line 2—2 of Fig. 1 and illustrating the resonant structure forming the oscillatory circuit and its dielectric core.

Referring now to Figs. 1 and 2 there is illustrated an ultra high frequency oscillation generator in accordance with the present invention. The generator includes an oscillatory or resonant circuit consisting of resonant structure 10 which is a cylinder of conducting material having a slot 11 along its length. Dielectric core 12 is arranged to move with respect to slotted cylinder 10. Dielectric core 12 consists of a material having a high dielectric constant which is preferably larger than 1,000. Certain strontium, barium or calcium titanates have dielectric constant of the order of 4,000. Such dielectric materials which have been disclosed, for example, in the patents to Wainer 2,399,082, 2,436,839 and 2,402,518 are available with a power factor of less than 5 per cent corresponding to a loss of .05.

Slotted cylinder 10 represents a resonant structure having distributed inductance and capacitance. The inductance is substantially uniformly distributed, and the cylinder has a uniform voltage gradient across slot 11 so that the voltage is distributed substantially uniformly along its surface. The frequency at which cylinder 10 resonates is determined by its dimensions, that is, by its diameter and length. When the diameter of cylinder 10 increases, its distributed inductance increases but, on the other hand, when its length increases, the inductance will decrease. Cylinder 10 may be considered as a strap wound coil having a single turn.

Dielectric core 12 preferably fits closely within cylinder 10 as illustrated in Fig. 2. It is to be understood that dielectric core 12 also will be resonant at a frequency which is determined by its dimensions or size. Core 12 should, of course, not be resonant within the frequency range to which the resonant circuit consisting of cylinder 10 may be tuned. However, the resonant frequency of core 12 may easily be changed by varying its size or its configuration.

Cylinder 10 is mounted by a suitable insulating material 13 on base plate 14 which bears gear rack 15. Shaft 16 is secured to dielectric core 12 and preferably consists of an insulating material. Pinion 17 is mounted on shaft 16 by bearing 18 and may be rotated by control knob 20 as shown schematically. Thus, when control knob 20 is rotated, pinion 17 engages with rack 15 and dielectric core 12 may be moved into or out of cylinder 10. Thus, the distributed capacitance of resonant cylinder 10 may be altered, that is, when core 12 moves to the left into cylinder 10 the distributed capacitance will increase, and the resonant frequency of the circuit will decrease.

The oscillatory circuit consisting of resonant cylinder 10 and dielectric core 12 may form part of an oscillation generator. The generator may include vacuum tube 21 which may be a triode of the 6F4 type, the base portion of which includes a plurality of contact prongs. Prongs 22, 23 are connected together as shown schematically, and make contact with the anode of the tube. Prongs 24 and 25 are also connected together as shown, and lead to the control grid of the tube. Prong 26 is connected to the cathode and prongs 27, 28 lead to the cathode filament.

As shown in Fig. 1, prong 23 is connected to cylinder 10 adjacent slot 11. On both sides of slot 11 cylinder 10 has high impedance portions, that is, the voltage has an antinode. The diametrically opposite portion of cylinder 10, that is, portion 30 (Fig. 2) has a voltage node to which a suitable voltage supply indicated by battery 31 may be connected through choke coil 32. Prong 24 is connected through capacitor 34 to the other high impedance portion of cylinder 10. Thus, cylinder 10 is connected through prongs 23, 24 to the anode and control grid of triode 21. It will be observed that the connections to the anode and control grid can be made through very short leads which is very important in ultra high frequency work in view of the inductance represented by any lead.

Grid leak resistor 35 is connected between prongs 25 and 26, that is, between the control grid and cathode of the tube. The cathode is grounded through resistor 36 while the filaments are energized by voltage source 37 connected between prongs 27, 28.

Figure 3:
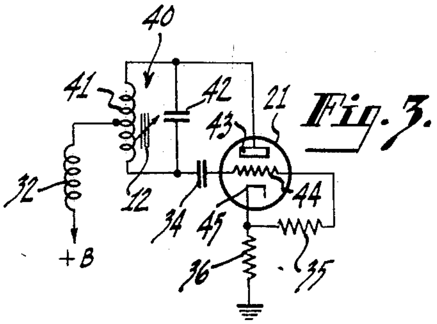
Fig. 3 is the equivalent circuit diagram of the oscillation generator of Fig. 1.

The equivalent circuit of the oscillation generator of Figs. 1 and 2 is illustrated in Fig. 3. Resonant circuit 40 represents the resonant structure of cylinder 10. For the sake of illustration, resonant circuit 40 has been shown with lumped inductance element 41 and lumped capacitor 42. Dielectric core 12 is schematically represented. One terminal of resonant circuit 40 is connected to anode 43 of triode 21 while the control grid 44 is connected to the other terminal of circuit 40 through coupling condenser 34. The positive voltage supply indicated at +B is connected through choke coil 32 to the midpoint of inductance element 41. Control grid 44 is connected to cathode 45 through grid leak resistor 35. Cathode 45 is grounded through cathode resistor 36.

From an inspection of the circuit diagram of Fig. 3 it will be obvious that the oscillation generator is connected as a Hartley oscillator. Cathode 45 is connected to the midpoint of inductance element 41 through cathode resistor 36, voltage supply +B and choke coil 32. The operation of the oscillation generator will be obvious and no further explanation is deemed to be necessary.

The generator of Figs. 1 and 2 operates best in the frequency range between 500 to 1,000 mc. It will, however, operate at frequencies as low as 150 mc. and as high as 1,200 mc., being limited at the high frequency end by the transit time of available tubes. The oscillation generator of Figs. 1 and 2 may have a tuning range of 160 to 510 mc. with a cylinder 10 having an outer diameter of $1\frac{1}{4}''$, an inner diameter of 1.034'' and a length of $1\frac{5}{16}''$. Core 12 has the same length as cylinder 10 and a clearance with cylinder 10 of .001''. The tuning range has a ratio of 3.2. Another embodiment of the oscillation generator of Figs. 1 and 2 had a tuning range between 325 and 660 mc. corresponding to a tuning ratio of 2.04. In that case, cylinder 10 had an outer diameter of 1" and an inner diameter of ⅞" and a length of 1¼". The length of core 12 was the same as that of cylinder 10 and a clearance of .003" was provided between core 12 and cylinder 10. With different dimensions of cylinder 10, other tuning ranges can readily be obtained. If the oscillatory circuit 10 is used as a wave meter or coupling element where the capacitance loading of tube 21 is absent, a considerably larger tuning range can be obtained.

Figure 4:
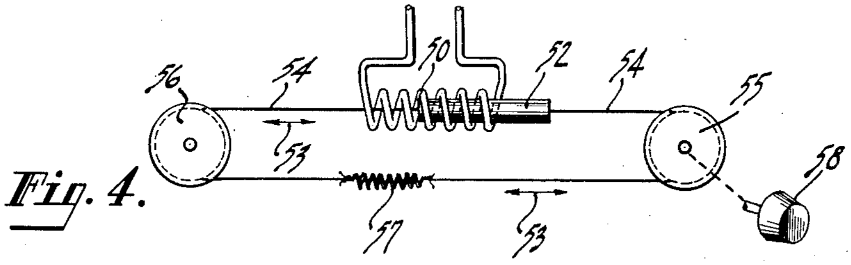
Fig. 4 is a schematic view of a dielectric tuning system embodying the present invention and including an inductance coil.

Fig. 4 illustrates another dielectric tuning system in accordance with the present invention. The ultra high frequency tunable circuit comprises wire wound coil 50. Dielectric core 52 may be moved relatively to core 50 as shown by arrows 53. Movement of dielectric core 52 into coil 50 will increase the distributed capacitance between the individual windings of coil 50. Dielectric core 52 may be moved by strings 54 guided by pulleys 55, 56. Spring 57 is interposed between the free ends of strings 54 to provide proper tension. Pulley 55 may be rotated by control knob 58 which will control the resonant frequency of coil 50. It will be observed that a lumped capacitance is not needed and that coil 50 is resonated solely by its distributed capacitance.

The resonant circuit consisting of coil 50 may be resonated between 25 and 50 megacycles although the best working range is between 25 and 30 megacycles. By way of example, coil 50 may consist of 20 turns of .040 enameled wire while dielectric core 52 may have a diameter of .9" and a length of 1¼". When dielectric core 52 is moved axially within coil 50, the tuning range of the circuit was 25.5 to 48.6 megacycles.

Figure 5:
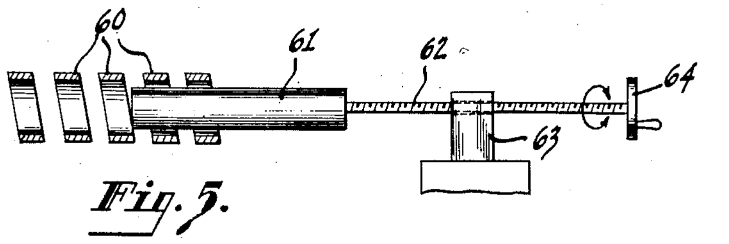
Fig. 5 is a schematic view of a modified dielectric tuning system in accordance with the invention having a strap wound coil resonated by a dielectric core.

Fig. 5 illustrates strap wound coil 60 within which dielectric core 61 may slide to alter the resonant frequency of the coil in accordance with the invention. Core 61 may be secured to threaded rod 62 which preferably consists of an insulating material. Rod 62 is supported by bearing 63 and may be rotated by handle 64 to move dielectric core 61 into and out of strap wound coil 60.

The capacitance change obtained when dielectric core 61 moves relatively to strap wound coil 60 is larger than that which can be obtained in the circuit of Fig. 4. The tuning range of the resonant circuit is between approximtaely 50 and 80 megacycles.

There has thus been disclosed a dielectric tuning system for tuning a resonant circuit within an ultra high frequency range. The distributed capacitance of an inductance element such as a wire wound coil or a strap wound coil may be altered by means of a dielectric core. Alternatively, the resonant frequency of a resonant structure which may consist of a slotted cylinder having distributed inductance and capacitance may be changed by a dielectric core. Such a resonant structure has a large tuning range and a comparatively high Q and is suitable for the frequency range between 150 and 1200 megacycles. The resonant circuit or structure may be tuned by a single control and does not require sliding contacts. The resonant structure may form the oscillatory circuit of an oscillation generator.

What is claimed is:

1. A dielectric tuning system for ultra high frequencies comprising an inductance winding and a core consisting only of a material having a high dielectric constant, said core being movable relatively to said winding to alter the resonant frequency of said system by changing the amount of said material inserted within said inductance winding.

2. A dielectric tuning system for ultra high frequencies comprising an inductance coil and a core consisting of a material having a dielectric constant larger than 1,000, said core being movable relatively to said coil to change the resonant frequency of said coil.

3. A dielectric tuning system for ultra high frequencies comprising a strap wound coil and a core having a high dielectric constant, said core being movable relatively to said coil to vary the resonant frequency of said coil.

4. A resonant circuit tunable within an ultra high frequency range and comprising a coil wound of a flat strap and a core consisting of a material having a dielectric constant in excess of 1,000, said core being movable axially within said coil to alter the resonant frequency of said coil.

5. An ultra high frequency tunable circuit comprising an elongated resonant structure of conducting material slotted along its length and having distributed inductance and capacitance, and a core consisting of a material having a high dielectric constant, said core being movable relatively to said structure to change the resonant frequency of said circuit by altering the quantity of said material in proximity with said structure.

6. An ultra high frequency tunable circuit comprising a resonant metallic structure having substantially uniformly distributed inductance and a substantially uniform voltage distribution along its outer surface, and a core consisting of a material having a dielectric constant larger than 1,000, said core being movable relatively to said structure to vary the resonant frequency of said structure.

7. An ultra high frequency oscillatory circuit comprising a slotted cylinder of conducting material and a core having a high dielectric constant, said core being movable relatively to said cylinder to vary the resonant frequency of said circuit.

8. An ultra high frequency oscillatory circuit comprising a cylinder of conducting material slotted along its length and a core having a high dielectric constant, said core being movable relatively to said cylinder to vary the resonant frequency of said circuit.

9. An ultra high frequency oscillatory circuit comprising a cylinder of conducting material slotted along its length and a core having a dielectric constant in excess of 1,000, said core fitting closely within said cylinder and being movable axially within said cylinder to vary the resonant frequency of said circuit.

10. An ultra high frequency oscillation generator comprising a discharge device having a cathode, a control grid and an anode, an oscillatory circuit including a slotted cylinder of conducting material having two high impedance portions, one of said portions being connected to said anode, an impedance element for coupling the other one of said portions to said grid, a source of voltage connected between said cathode and said cylinder, and a core of high dielectric material movable with respect to said cylinder to vary the resonant frequency of said circuit.

11. An ultra high frequency oscillation generator comprising an electron discharge device having a cathode, a control grid and an anode, an oscillatory circuit including a cylinder of conducting material slotted along its length and having two high impedance portions, one of said portions being connected to said anode, a capacitor for coupling the other one of said portions to said grid, a source of voltage and an impedance element connected between said cathode and said cylinder, and a core of high dielectric material slidable within said cylinder to vary the resonant frequency of said circuit.

12. An ultra high frequency oscillation generator comprising a vacuum tube having a cathode, a control grid and an anode, an oscillatory circuit including a cylinder of conducting material slotted along its length and having two high impedance portions adjacent the slot, one of said portions being connected to said anode, a capacitor for coupling the other one of said portions to said grid, a source of voltage including an impedance element connected serially between said cathode and the voltage node of said cylinder, and a core of high dielectric material slidable axially within said cylinder to vary the resonant frequency of said circuit.

13. A dielectric tuning system comprising in combination, an inductor having an appreciable surface area disposed essentially in the form of an apertured hollow cylindrical section and a cylindrical core element of substantially the same dimensions as said cylindrical section, said core element having a high dielectric constant and being movable within said inductor to change the tuning of said system.

ROBERT L. HARVEY.

REFERENCES CITED

The following references are of record in the file of this patent:

UNITED STATES PATENTS

| Number | Name | Date |
|---|---|---|
| 2,120,518 | Dreyer | June 14, 1938 |
| 2,157,855 | Koch | May 9, 1939 |
| 2,395,520 | Toth | Feb. 26, 1946 |
| 2,282,386 | Sinningor | May 12, 1946 |
| 2,403,349 | Dolberg | July 2, 1946 |
| 2,427,498 | Harvey | Sept. 16, 1947 |
| 2,442,264 | Campbell | May 25, 1948 |
| 2,483,893 | Everett | Oct. 4, 1949 |
| 2,543,891 | Carslon et al. | Mar. 6, 1951 |

OTHER REFERENCES

War Department Technical Manual, TM 11-1506, published Sept. 4, 1944; Fig. 184 on page 270, page 277; 2 pages of printed matter.